(12) United States Patent
Zhang et al.

(10) Patent No.: US 12,266,920 B2
(45) Date of Patent: Apr. 1, 2025

(54) THERMAL PROTECTION AND WARNING METHOD AND SYSTEM BASED ON JUNCTION TEMPERATURE PREDICTION FOR POWER DEVICES OF OFFSHORE WIND POWER CONVERTERS

(71) Applicant: SHANDONG UNIVERSITY, Shandong (CN)

(72) Inventors: Zhenbin Zhang, Shandong (CN); Jin Zhang, Shandong (CN); Ruiqi Wang, Shandong (CN); Yu Li, Shandong (CN); Zhen Li, Shandong (CN)

(73) Assignee: SHANDONG UNIVERSITY, Shandong (CN)

( * ) Notice: Subject to any disclaimer, the term of this patent is extended or adjusted under 35 U.S.C. 154(b) by 362 days.

(21) Appl. No.: 17/706,614

(22) Filed: Mar. 29, 2022

(65) Prior Publication Data
US 2022/0224105 A1    Jul. 14, 2022

Related U.S. Application Data

(63) Continuation-in-part of application No. PCT/CN2020/106880, filed on Aug. 4, 2020.

(30) Foreign Application Priority Data

Feb. 7, 2020    (CN) .......................... 202010082613.X

(51) Int. Cl.
H02H 7/10    (2006.01)
G01R 31/40    (2020.01)

(52) U.S. Cl.
CPC ............... *H02H 7/10* (2013.01); *G01R 31/40* (2013.01)

(58) Field of Classification Search
CPC .......... G01R 31/40; H01L 23/34; H02H 6/00; H02H 7/10; H02J 2300/28; H03K 2017/0806
See application file for complete search history.

(56) References Cited

U.S. PATENT DOCUMENTS

| | | | |
|---|---|---|---|
| 2019/0285689 A1* | 9/2019 | Degrenne | ................ G01K 1/14 |
| 2019/0377023 A1* | 12/2019 | Yao | ........................ G01K 7/427 |
| 2020/0029395 A1 | 1/2020 | Wagoner et al. | |

FOREIGN PATENT DOCUMENTS

| | | |
|---|---|---|
| CN | 103105410 | 5/2013 |
| CN | 105825019 | 8/2016 |

(Continued)

OTHER PUBLICATIONS

Shen, Haidong; et al., "IGBT Thermal Network Modeling Method Considering Thermal Effect," Semiconductor Technology, vol. 43, Issue 12, Dec. 2018, pp. 898-904.

(Continued)

*Primary Examiner* — Yoshihisa Ishizuka
(74) *Attorney, Agent, or Firm* — JCIPRNET

(57) ABSTRACT

The present invention discloses a thermal protection and warning method and system based on junction temperature prediction for a power device of an offshore wind power converter. The method includes: calculating a thermal resistance and a thermal capacitance corresponding to each layer inside the power device, and establishing a corresponding Cauer thermal network model; calculating power consumption at n future moments according to state variables at the n future moments corresponding to a minimized cost function, that is, calculating a variation trajectory of a heat flux parameter; calculating a variation trajectory of a junction temperature of the power device according to the Cauer thermal network model and the variation trajectory of the heat flux parameter; and comparing the calculated variation (Continued)

trajectory of the junction temperature with a warning temperature, and determining a current operating state of the power device.

13 Claims, 2 Drawing Sheets

(56) References Cited

FOREIGN PATENT DOCUMENTS

| CN | 106326532 | 1/2017 |
|---|---|---|
| CN | 107315877 | 11/2017 |
| CN | 108072821 | 5/2018 |
| CN | 108647436 | 10/2018 |
| CN | 109214124 | 1/2019 |
| CN | 110456264 | 11/2019 |
| CN | 111293671 | 6/2020 |

OTHER PUBLICATIONS

"International Search Report (Form PCT/ISA/210) of PCT/CN2020/106880," mailed on Nov. 10, 2020, with English translation thereof, pp. 1-8.

"Written Opinion of the International Searching Authority (Form PCT/ISA/237) of PCT/CN2020/106880," mailed on Nov. 10, 2020, with English translation thereof, pp. 1-9.

"Office Action of China Counterpart Application" with English translation thereof, issued on Nov. 2, 2020, p. 1-p. 11.

\* cited by examiner

| Electrical parameter | | Thermal parameter | |
| --- | --- | --- | --- |
| Name | Symbol | Name | Symbol |
| Voltage | $U/V$ | Temperature difference | $\Delta T/K$ |
| Current | $I/A$ | Heat flux | $P/W$ |
| Resistance | $R/V \cdot A^{-1}$ | Thermal resistance | $R_{th}/°C \cdot W^{-1}$ |
| Capacitance | $C/A \cdot s \cdot V^{-1}$ | Thermal Capacitance | $C_{th}/J \cdot °C^{-1}$ |

THERMAL PROTECTION AND WARNING METHOD AND SYSTEM BASED ON JUNCTION TEMPERATURE PREDICTION FOR POWER DEVICES OF OFFSHORE WIND POWER CONVERTERS

CROSS-REFERENCE TO RELATED APPLICATION

This is a continuation-in-part application of International Application No. PCT/CN2020/106880, filed on Aug. 4, 2020, which claims the priority benefits of China Application No. 202010082613.X, filed on Feb. 7, 2020. The entirety of each of the above-mentioned patent applications is hereby incorporated by reference herein and made a part of this specification.

TECHNICAL FIELD

The present invention relates to the field of thermal protection technologies for power devices of offshore wind power converters, and in particular, to a thermal protection and warning method and system based on junction temperature prediction for power devices of offshore wind power converters.

BACKGROUND

The description in this section merely provides background information related to the present invention and does not necessarily constitute the prior art.

Power devices applied to an application scenario such as an offshore wind power converter operates under severe operating conditions including a high voltage, a large current, strong electromagnetic interference, a time-varying load, and limited heat dissipation for a long time. Complicated operating condition changes cause waste heat generated by the power devices of the offshore wind power converter to be different, and a temperature of the device also greatly fluctuates, resulting in frequent stress fluctuation between the power devices, and severely affecting the service life of the power devices. Since materials of layers forming the power device body and the wind power converter have different thermal expansion coefficients, fluctuated temperatures may cause different phenomena such as fatigue degradation and abrasion to occur on the device body and the materials of the layers. If failure symptoms of the power device as a result of fatigue and abrasion cannot be timely monitored and alleviated by adopting effective measures, the safe and reliable operation of an entire system may be threatened. According to investigation, about 34% power electronic conversion system failure is caused by the failure of the power device. Therefore, the study on the junction temperature estimation method for the power device and the fault diagnosis strategy is of great significance to the reliable operation of the entire offshore wind power converter.

Conventionally, the equation $T_J = T_H + P \cdot R_{th}$ is used to obtain the junction temperature, considering the power consumption, measured case temperature, and the packaging thermal resistance of the power devices of the wind power converter. Then, a protection action is triggered when the junction temperature exceeds a predefined threshold. In the equation, $T_J$ is the junction temperature of the power device, $T_H$ is the case temperature of the device, P is the device loss, and $R_{th}$ is the packaging thermal resistance of the device.

However, the inventor found that the conventional calculation method can merely calculate a steady-state junction temperature of the power device, but an actual junction temperature variation trajectory is more complex than a steady-state junction temperature variation trajectory. The traditional calculation method of the junction temperature for power devices has lag effect. It takes long time for the quantity of heat transferred from the junction to the case. Therefore, the actual value of the junction temperature can be higher than the calculated value in the transient process. In the practical engineering application of the offshore wind power converter, in order to ensure the reliable operation of the power device, when the conventional calculation method is used, usually a sufficient margin is reserved during the setting of the junction temperature protection threshold, so as to protect the power device in advance. However, by means of such a protection mechanism, the physical limit of the power device cannot be fully utilized, resulting in the increase in the system costs and the reduction of working efficiency.

SUMMARY

In order to resolve the above problems, the present invention is intended to provide a thermal protection and warning method and system based on junction temperature prediction for a power device of an offshore wind power converter. By means of a power consumption variation trajectory of the power device and a corresponding Cauer thermal resistance-capacitance network model, a variation trajectory of the junction temperature of the power device in some time can be predicted, and a moment at which the junction temperature of the power device reaches a warning temperature can also be obtained. Therefore, the power device can be protected within a safe time duration before the junction temperature of the power device reaches the warning temperature.

In some implementations, the following technical solutions are adopted:

A thermal protection and warning method based on junction temperature prediction for a power device of an offshore wind power converter includes:
- calculating a thermal resistance and a thermal capacitance corresponding to each layer inside the power device, and establishing a corresponding Cauer thermal network model;
- calculating power consumption at n future moments according to state variables at the n future moments corresponding to a minimized cost function, that is, calculating a variation trajectory of a heat flux parameter;
- calculating a junction temperature variation trajectory of the power device, based on the Cauer thermal network model and the variation trajectory of the heat flux parameter;
- comparing the calculated variation trajectory of the junction temperature with a warning temperature, and determining a current operating state of the power device;
- if the variation trajectory of the junction temperature does not exceed the warning temperature, applying an optimal state corresponding to a minimized cost function to a power converter to proceed with normal operation;
- if the variation trajectory of the junction temperature exceeds the warning temperature beyond a warning period, performing warning in advance for a moment at which the variation trajectory of the junction temperature exceeds the warning temperature, and still applying the optimal state corresponding to the minimized cost function to the power converter; and if the variation trajectory of the junction temperature exceeds the warning temperature within the warning period, blocking a pulse signal, and enabling a protection mechanism in response, to protect the power device.

According to the solution of the present invention, a power consumption variation trajectory of the power device and the corresponding Cauer thermal resistance-capacitance network model are combined. In this way, the power device can be protected in advance within a safe period before the predicted junction temperature reaches the warning temperature, thereby ensuring that the power device operates within a safe temperature range.

In some other implementations, the following technical solutions are adopted.

A thermal protection and warning system based on junction temperature prediction for a power device of an offshore wind power converter includes:

an apparatus, configured to calculate a thermal resistance and a thermal capacitance corresponding to each layer inside the power device, and establish a corresponding Cauer thermal network model;

an apparatus, configured to calculate power consumption at n future moments according to state variables at the n future moments corresponding to a minimized cost function, that is, calculate a variation trajectory of a heat flux parameter;

an apparatus, configured to calculate a variation trajectory of a junction temperature of the power device according to the Cauer thermal network model and the variation trajectory of the heat flux parameter; and an apparatus, configured to compare the calculated variation trajectory of the junction temperature with a warning temperature, and determine a current operating state of the power device.

In some other implementations, the following technical solutions are adopted.

A terminal device is provided, including a processor and a computer-readable storage medium. The processor is configured to implement instructions. The computer-readable storage medium is configured to store a plurality of instructions. The instructions are adapted to be loaded by the processor to perform the above thermal protection and warning method based on junction temperature prediction for a power device of an offshore wind power converter.

In some other implementations, the following technical solutions are adopted.

A computer-readable storage medium is provided, storing a plurality of instructions. The instructions are adapted to be loaded by a processor of a terminal device to perform the above thermal protection and warning method based on junction temperature prediction for a power device of an offshore wind power converter.

Compared with the related art, the beneficial effects of the present invention are as follows:

Based on the model prediction control and the Cauer thermal network model, real-time measured data is used to continuously repeat the above process to update a variation trajectory of a predicted junction temperature, so that the power device can be protected in advance within the safe period before the predicted junction temperature reaches the warning temperature. In this way, it can be ensured that the power device operates within a safe temperature range, and the physical limit of the power device can be fully utilized. Therefore, the stability and working efficiency of the power device can be better enhanced, and the quality of a product can be improved, greatly improving the reliability and electrical energy conversion efficiency of power devices of the offshore wind power converter.

According to the present invention, a lag effect of a conventional solution is effectively overcome. An effective thermal protection and warning mechanism for the power device is established according to the predicted junction temperature. In this way, the physical limit of the power device can be fully utilized. Therefore, the stability and working efficiency of the power device can be better enhanced, reducing system costs, and greatly improving the reliability and electrical energy conversion efficiency of the power devices of the offshore wind power converter.

DETAILED DESCRIPTION

Figures 1, 2:
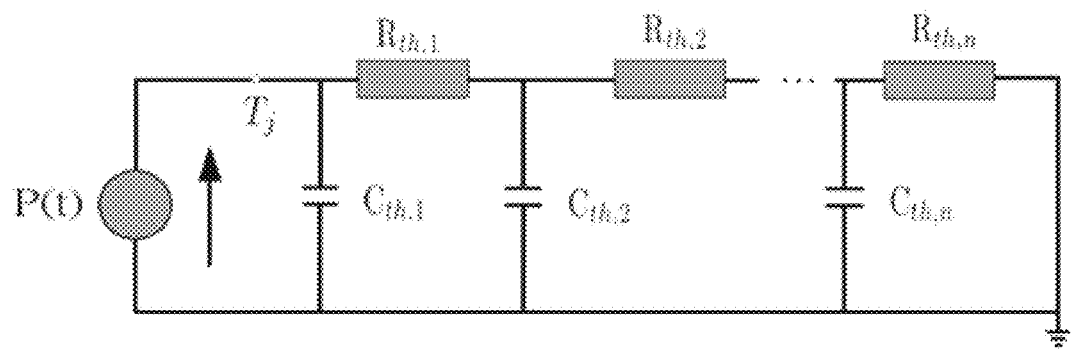
FIG. 1 is a schematic diagram of a Cauer thermal resistance-capacitance network model according to an embodiment of the present invention.
FIG. 2 shows a correspondence between electro-heat parameters according to an embodiment of the present invention.

It should be noted that the following detailed descriptions are all exemplary and are intended to provide further descriptions of this application. Unless otherwise specified, all technical and scientific terms used in the present invention have the same meaning as commonly understood by a person of ordinary skill in the art to which this application belongs.

It should be noted that terms used herein are merely for describing specific implementations and are not intended to limit exemplary implementations according to this application. As used herein, the singular form is also intended to include the plural form unless the context clearly dictates otherwise. In addition, it should further be understood that, terms "comprise" and/or "include" used in this specification indicate that there are features, steps, operations, devices, components, and/or combinations thereof.

The embodiments in the present invention and features in the embodiments may be mutually combined in case that no conflict occurs.

Embodiment I

In one or more implementations, a thermal protection and warning method based on junction temperature prediction for a power device of an offshore wind power converter is disclosed. The method includes the following process.

A thermal resistance and a thermal capacitance corresponding to each layer inside the power device of the offshore wind power converter are calculated, and a corresponding Cauer thermal network model is established.

A temperature model is established for the power device of the offshore wind power converter, and a temperature inside the device is calculated. Power consumption at n future moments is calculated according to state variables at the n future moments corresponding to a minimized cost function. That is, a variation trajectory of a heat flux parameter is calculated.

A variation trajectory of a junction temperature of the power device of the offshore wind power converter is calculated according to the Cauer thermal network model and the variation trajectory of the heat flux parameter.

The calculated variation trajectory of the junction temperature is compared with a warning temperature, and a current operating state of the power device of the offshore wind power converter is determined.

Specifically, in the solution of the present invention, based on a model prediction control principle, modeling is performed on a system. A state variation trajectory of the system in a period is predicted by using an input variable and a calculated state variable. An optimal switch state is selected by using the principle of minimizing the cost function. The variation trajectory of the system in a period is calculated according to the state variable corresponding to the optimal switch state. In addition, based on the heat conduction theory, the thermal-electric analogy principle, and a physical structure and properties of the power device itself, a Cauer thermal resistance-capacitance network model of the power device is established. Through a combination of model prediction control and the Cauer thermal resistance-capacitance network model, a junction temperature of the power device is predicted, and the power device is protected when the junction temperature is close to a warning temperature.

The method for establishing the Cauer thermal resistance-capacitance network model, predicting the variation trajectories of the state variables in a period in the system, and predicting the junction temperature of the power device of the offshore wind power converter, and a protection strategy provided in the embodiments of the present invention are to be respectively described below.

The thermal-electric analogy principle is a basic theory of a thermal network model. On this basis, an IGBT is used as an example to describe the method for establishing the Cauer thermal network model of the power device. In the IGBT, a parallel connection is formed between a thermal resistance and a thermal capacitance in each layer, a series connection is formed between thermal impedances of the layers, and a heat loss generated by a chip of the IGBT is used as a heat source. The Cauer thermal network model is shown in FIG. 1. In the figure, P(t) is a heat flux parameter related to time. A $T_J$ point represents a junction temperature of a device, $R_{th}$ is a thermal resistance of the device, and $C_{th}$ is a thermal capacitance of the device. The thermal resistance and thermal capacitance parameters of the Cauer thermal network model are in a one-to-one correspondence with the physical structures of the layers of the device, and are related to the physical structures and properties of the device. By using the thermal-electric analogy principle, expressions of $R_{th}$ and $C_{th}$ may be obtained. The expression of the $R_{th}$ is $R_{th}=1/\lambda \cdot d/a$. In the expression, $\lambda$ is a heat conductivity coefficient, d is a thickness of a material in a heat transfer direction, and A is an effective area of the material for heat transfer. The expression of the $C_{th}$ is $C_{th}=c_p \rho dA$. In the expression, $c_p$ is a specific heat capacity at a constant pressure, and $\rho$ is a density of the material. Therefore, based on the physical structures and properties of the layers of the IGBT, corresponding thermal resistance values and thermal capacitance values may be obtained by using the above two expressions. As shown in FIG. 2, the thermal parameters are converted to corresponding electrical parameters, to establish the corresponding Cauer thermal network model.

Figure 3:
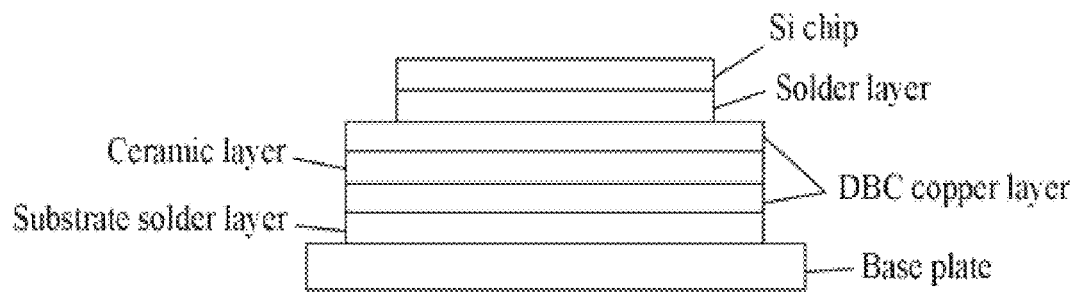
FIG. 3 shows a physical layer structure of an insulated gate bipolar transistor (IGBT) according to an embodiment of the present invention.

A general structure of the IGBT is shown in FIG. 3, including an Si chip, a solder layer, a DBC copper layer, a ceramic layer, a DBC copper layer, a substrate solder layer, a base plate, and a heat dissipater added during heat dissipation design later. In a case that the physical structures and properties of the layers inside the IGBT are obtained, the thermal resistance and the thermal capacitance corresponding to the layers may be directly calculated by using the expressions of $R_{th}$ and $C_{th}$, to establish the corresponding Cauer thermal network model.

Generally, a working temperature of the IGBT is in a range of 25-200° C. A universal IGBT structure is mainly made from Si, Cu, and Al. According to the previous research reports, it may be learned that the heat conductivity coefficients of Cu and Al are in a range of −50~200° C., and may be considered to be similar and remain unchanged, and the temperature has a small influence on the heat conductivity coefficients. Although the temperature has a significant influence on the heat conductivity coefficients of Si and SiC, according to the previous research reports, variations in the heat conductivity coefficients of Si and SiC with the temperature have a small influence on a calculation result of a final junction temperature. Therefore, the influence of temperature changes on the material properties is not considered temporarily. Therefore, in a case that the physical structures and properties of the layers inside the IGBT are acquired, the thermal resistance and the thermal capacitance corresponding to the layers may be directly calculated by using the expressions of $R_{th}$ and $C_{th}$, to establish the corresponding Cauer thermal network model.

However, during the engineering application, in most cases, it is difficult to acquire the physical structures and properties of the layers inside the IGBT due to a plurality of factors. In this case, model conversion may be performed by using a Foster thermal network model parameter in a data book, to obtain Cauer thermal network model parameters. For the conversion method, refer to the standard JESD 51-14. The previous research report indicates that an error between the calculated junction temperature of the Cauer thermal network model obtained by using the conversion method and an actually measured result is within an acceptable range.

Figure 4:
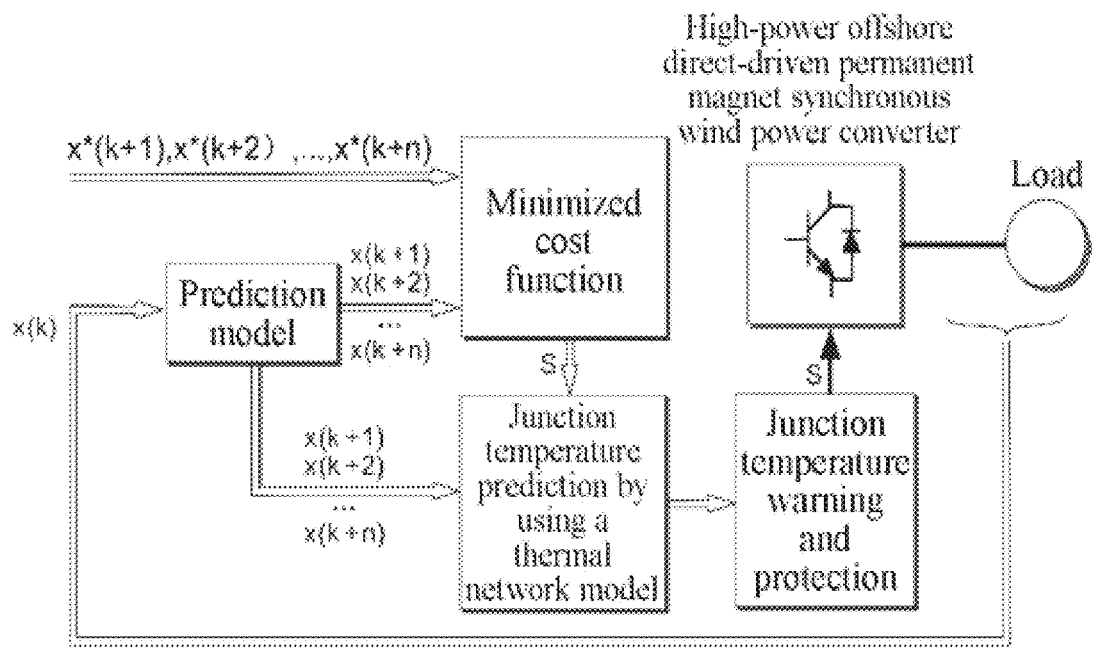
FIG. 4 is a flowchart of prediction of a junction temperature according to an embodiment of the present invention.

The advantage of model prediction control is the capability of predicting a variation trajectory of a control variable at n future moments by combining a system model, a cost function, an input variable, a state variable measured by a measuring apparatus, and a set reference variable. As shown in FIG. 4, modeling is performed on a system. According to a measured value x(k) obtained by the measuring apparatus, the state variable x(k+1), x(k+2), . . . , x(k+n) at the n future moments may be calculated by using a prediction model. The state variable at the n future moments corresponding to a minimized cost function is calculated according to the set reference variable x*(k+1), x*(k+2), . . . , x*(k+n) and the related limitation by using the cost function $J=[x_1^*(k+1)-x_1(k+1)]^2+ \ldots +\lambda_n \cdot [x_n^*(k+1)-x_n(k+1)]^2$. Power consumption at the n future moments is calculated according to state variables at the n future moments corresponding to the minimized cost function. That is, a variation trajectory of a heat flux parameter P(t) is calculated.

By means of the thermal resistance values and the thermal capacitance values of the layers of the Cauer thermal network model, an equivalent thermal impedance of the power device may be calculated.

$$Z'_{thJC}(s) = \cfrac{1}{sC_1 + \cfrac{1}{R_1 + \cfrac{1}{sC_2 + \cfrac{1}{R_2 + \cfrac{1}{sC_3 + \ldots + \cfrac{1}{R_n}}}}}}$$

$C_1$, $R_1$, $C_2$, $R_2$, ..., $C_n$, and $R_n$ are respectively the thermal resistance values and the thermal capacitance values corresponding to the layers. A case temperature $T_H$ is measured and calculated. Since a time constant of a temperature of a heat dissipation apparatus is far greater than a sampling period of a control system, it is assumed that the case temperature remains unchanged before the next measuring moment. By using an equation $T_J(t)=T_H+P(t) \cdot Z'_{thJC}$, the variation trajectory of the junction temperature of the power device of the offshore wind power converter may be calculated by using the case temperature $T_H$, the equivalent thermal impedance $Z'_{thJC}$, and the variation trajectory of the heat flux parameter $P(t)$. The calculated variation trajectory of the junction temperature is compared with a warning temperature. If the variation trajectory exceeds the warning temperature within a warning period, a pulse signal is blocked, and a protection mechanism is enabled in response, to protect the power device. If the variation trajectory of the junction temperature exceeds the warning temperature beyond the warning period, warning is performed in advance for a moment at which the variation trajectory of the junction temperature exceeds the warning temperature, and the optimal state corresponding to the minimized cost function is still applied to the power converter to continue the normal operation. If the variation trajectory of the junction temperature does not exceed the warning temperature, the optimal state corresponding to the minimized cost function is applied to the power converter to continue the normal operation. After a new measuring moment is reached, a new measured value is calculated by using the measuring apparatus. The above operations are repeated. The state variables at the n future moments are predicted by using the new measured state variable. The state variable at the n future moments corresponding to the minimized cost function is calculated. Then, a new heat flux parameter $P(t)$ is calculated. By combining the new measured case temperature, the variation trajectory of the junction temperature is predicted, so as to determine whether the power device of the offshore wind power converter operates within a safe temperature range.

Different topologies have different types and calculation methods of switch states. Different applications also have different types and quantities of controlled variables. All of the requirements can be satisfied by adjusting various weight coefficients of the cost function. Any power electronic converter topology may be adopted for a converter in FIG. 4, and a quantity of phases is not limited either. A corresponding load in FIG. 4 may be a motor, a power grid, or other active or passive loads. The controlled variables involved in the above process may be the switch state, a voltage, or a current calculated by using any of possible operations. The problem of the calculated quantity during the multi-step prediction involved in the prediction process has been effectively resolved by using an optimization algorithm such as sphere decoding. Therefore, details will not be described herein again.

Based on the model prediction control and the Cauer thermal network model, real-time measured data is used to continuously repeat the above process to update a variation trajectory of a predicted junction temperature, so that the power device of the offshore wind power converter can be protected in advance within the safe period before the predicted junction temperature reaches the warning temperature. In this way, it can be ensured that the power device of the offshore wind power converter operates within a safe temperature range, and the physical limit of the power device of the offshore wind power converter can be fully utilized. Therefore, the stability and working efficiency of the power device can be better enhanced, the quality of a product can be improved, and the reliability and electrical energy conversion efficiency of the power device of the offshore wind power converter are greatly improved.

Embodiment II

In one or more implementations, a thermal protection and warning system based on junction temperature prediction for a power device of an offshore wind power converter is disclosed. The system includes:
an apparatus, configured to calculate a thermal resistance and a thermal capacitance corresponding to each layer inside the power device of the offshore wind power converter, and establish a corresponding Cauer thermal network model;
an apparatus, configured to calculate power consumption at n future moments according to state variables at the n future moments corresponding to a minimized cost function, that is, calculate a variation trajectory of a heat flux parameter;
an apparatus, configured to calculate a variation trajectory of a junction temperature of the power device of the offshore wind power converter according to the Cauer thermal network model and the variation trajectory of the heat flux parameter; and
an apparatus, configured to compare the calculated variation trajectory of the junction temperature with a warning temperature, and determine a current operating state of the power device of the offshore wind power converter.

Specific implementation methods of the above apparatuses are the same as the method disclosed in Embodiment I, and details will not be described again.

Embodiment III

In one or more implementations, a terminal device is disclosed. The terminal device includes a server. The server includes a memory, a processor, and a computer program stored in the memory and executable on the processor. When the processor executes the program, the thermal protection and warning method based on junction temperature prediction for a power device of an offshore wind power converter according to Embodiment I is performed. For brevity, details are not described herein again.

It is to be understood that, in this embodiment, the processor may be a central processing unit (CPU), or may be a general-purpose processor, a digital signal processor (DSP), an application-specific integrated circuit (ASIC), a ready-made field-programmable gate array (FPGA), or a programmable logic device, a discrete gate or transistor logic device, a discrete hardware component, or the like. The general-purpose processor may be a microprocessor, or may be any conventional processor, or the like.

The memory may include a read-only memory and a random access memory, and provide instructions and data to the processor. A part of the memory may further include a nonvolatile random access memory. For example, the memory may further store information about a device type.

During the implementation, each step of the above method may be completed by using an integrated logic circuit of hardware in the processor or an instruction in a form of software.

The thermal protection and warning method based on junction temperature prediction for a power device of an offshore wind power converter according to Embodiment I may be directly performed by a hardware processor, or may be performed by a combination of hardware and software modules in the processor. The software module may be located in a mature storage medium in the art, such as a random access memory, a flash memory, a read-only memory, a programmable read-only memory, an electrically-erasable programmable memory, a register, or the like. The storage medium is located in the memory, and the processor reads information in the memory and completes the steps of the above method in combination with hardware of the processor. In order to avoid repetition, details will not be described herein.

A person of ordinary skill in the art may notice that the exemplary units and algorithm steps described with reference to this embodiment can be implemented in electronic hardware, or a combination of computer software and electronic hardware. Whether the functions are executed in a mode of hardware or software depends on particular applications and design constraint conditions of the technical solutions. A person skilled in the art may use different methods to implement the described functions for each particular application, but it is not to be considered that the implementation goes beyond the scope of this application.

The specific implementations of the present invention are described above with reference to the accompanying drawings, but are not intended to limit the protection scope of the present invention. A person skilled in the art should understand that various modifications or deformations may be made without creative efforts based on the technical solutions of the present invention, and such modifications or deformations shall fall within the protection scope of the present invention.

What is claimed is:

1. A thermal protection and warning method based on junction temperature prediction for a power device of an offshore wind power converter, the method comprising:
   measuring real-time measured case temperature by measuring apparatus;
   calculating a thermal resistance and a thermal capacitance corresponding to each layer inside the power device, and establishing a corresponding Cauer thermal network model;
   calculating power consumption at n future moments according to state variables at the n future moments corresponding to a minimized cost function, to obtain a variation trajectory of a heat flux parameter, comprising:
   calculating an equivalent thermal impedance of the power device by using thermal resistance values and thermal capacitance values of the all layers of the Cauer thermal network model; and
   calculating a variation trajectory of the junction temperature of the power device by using the real-time measured case temperature, the calculated equivalent thermal impedance, and the calculated variation trajectory of the heat flux parameter;
   calculating a variation trajectory of a junction temperature of the power device according to the Cauer thermal network model and the variation trajectory of the heat flux parameter; and
   comparing the calculated variation trajectory of the junction temperature with a warning temperature, and determining a current operating state of the power device, comprising:
   if the variation trajectory of the junction temperature does not exceed the warning temperature, applying an optimal state corresponding to a minimized cost function to the offshore wind power converter to proceed with normal operation;
   if the variation trajectory of the junction temperature exceeds the warning temperature beyond a warning period, performing warning in advance for a moment at which the variation trajectory of the junction temperature exceeds the warning temperature, and still applying the optimal state corresponding to the minimized cost function to the offshore wind power converter; and
   if the variation trajectory of the junction temperature exceeds the warning temperature within the warning period, blocking a pulse signal, and controlling a switch state, a voltage, or a current of the power device, to protect the power device.

2. The thermal protection and warning method based on the junction temperature prediction for the power device of the offshore wind power converter according to claim 1, wherein the operation of calculating the thermal resistance and the thermal capacitance corresponding to the each layer inside the power device, and establishing the corresponding Cauer thermal network model specifically comprises:
   acquiring a physical structure and properties of the each layer inside the power device, directly calculating the thermal resistance and the thermal capacitance corresponding to the each layer by using equations for the thermal resistance and the thermal capacitance, and establishing the corresponding Cauer thermal network model;
   or
   performing model conversion by using a Foster thermal network model parameter in a data book, to obtain a Cauer thermal network model parameter.

3. A terminal device, comprising a processor and a non-transitory computer-readable storage medium, wherein the processor is configured to implement instructions; the non-transitory computer-readable storage medium is configured to store a plurality of instructions; and the instructions are adapted to be loaded by the processor to perform the thermal protection and warning method based on junction temperature prediction for a power device of an offshore wind power converter according to claim 2.

4. A non-transitory computer-readable storage medium, storing a plurality of instructions, wherein the instructions are adapted to be loaded by a processor of a terminal device to perform the thermal protection and warning method based on junction temperature prediction for a power device of an offshore wind power converter according to claim 2.

5. The thermal protection and warning method based on the junction temperature prediction for the power device of the offshore wind power converter according to claim 1, wherein the operation of obtaining the state variables at the n future moments corresponding to the minimized cost function specifically comprises:

establishing a temperature model for the power device, calculating a temperature inside the device, calculating the state variables at the n future moments, and calculating the state variables at the n future moments corresponding to the minimized cost function by using a cost function according to a set reference variable and a set limitation.

6. A terminal device, comprising a processor and a non-transitory computer-readable storage medium, wherein the processor is configured to implement instructions; the non-transitory computer-readable storage medium is configured to store a plurality of instructions; and the instructions are adapted to be loaded by the processor to perform the thermal protection and warning method based on junction temperature prediction for a power device of an offshore wind power converter according to claim 5.

7. A non-transitory computer-readable storage medium, storing a plurality of instructions, wherein the instructions are adapted to be loaded by a processor of a terminal device to perform the thermal protection and warning method based on junction temperature prediction for a power device of an offshore wind power converter according to claim 5.

8. The thermal protection and warning method based on the junction temperature prediction for the power device of the offshore wind power converter according to claim 1, wherein the variation trajectory of the junction temperature of the power device is specifically:

$$T_j(t) = T_H + P(t) \cdot Z'_{thJC}$$

wherein $T_H$ is the measured case temperature, $Z'_{thJC}$ is the equivalent thermal impedance, and $P(t)$ is the heat flux parameter.

9. A terminal device, comprising a processor and a non-transitory computer-readable storage medium, wherein the processor is configured to implement instructions; the non-transitory computer-readable storage medium is configured to store a plurality of instructions; and the instructions are adapted to be loaded by the processor to perform the thermal protection and warning method based on junction temperature prediction for a power device of an offshore wind power converter according to claim 8.

10. A non-transitory computer-readable storage medium, storing a plurality of instructions, wherein the instructions are adapted to be loaded by a processor of a terminal device to perform the thermal protection and warning method based on junction temperature prediction for a power device of an offshore wind power converter according to claim 8.

11. The thermal protection and warning method based on the junction temperature prediction for the power device of the offshore wind power converter according to claim 1, wherein after a new measurement moment is reached, the variation trajectory of the junction temperature of the power device is redetermined to determine whether the power device operates within a safe temperature range.

12. A terminal device, comprising a processor and a non-transitory computer-readable storage medium, wherein the processor is configured to implement instructions; the non-transitory computer-readable storage medium is configured to store a plurality of instructions; and the instructions are adapted to be loaded by the processor to perform the thermal protection and warning method based on junction temperature prediction for a power device of an offshore wind power converter according to claim 1.

13. A non-transitory computer-readable storage medium, storing a plurality of instructions, wherein the instructions are adapted to be loaded by a processor of a terminal device to perform the thermal protection and warning method based on junction temperature prediction for a power device of an offshore wind power converter according to claim 1.

* * * * *